United States Patent
Niroomand

(10) Patent No.: US 7,888,944 B2
(45) Date of Patent: Feb. 15, 2011

(54) POWER GAUGE FOR ACCURATE MEASUREMENT OF LOAD CURRENT

(75) Inventor: Ehsan Niroomand, Aliso Viejo, CA (US)

(73) Assignee: Broadcom Corporation, Irvine, CA (US)

(*) Notice: Subject to any disclaimer, the term of this patent is extended or adjusted under 35 U.S.C. 154(b) by 77 days.

(21) Appl. No.: 11/788,317

(22) Filed: Apr. 18, 2007

(65) Prior Publication Data
US 2008/0258711 A1    Oct. 23, 2008

(51) Int. Cl.
*G01N 27/416* (2006.01)
(52) U.S. Cl. .................... 324/428; 320/132; 320/149
(58) Field of Classification Search .......... 320/132, 320/149, DIG. 18, DIG. 21; 324/429
See application file for complete search history.

(56) References Cited
U.S. PATENT DOCUMENTS
7,196,523 B1 * 3/2007 Yamada ............... 324/428

2008/0197707 A1 * 8/2008 Chi Yang ............... 307/71

* cited by examiner

*Primary Examiner*—Edward Tso
*Assistant Examiner*—Ramy Ramadan
(74) *Attorney, Agent, or Firm*—Farjami & Farjami LLP

(57) ABSTRACT

According to one exemplary embodiment, a power gauge for accurately measuring current consumed by a load coupled to a power source includes a current sense resistor having a first terminal coupled to the power source and a second terminal coupled to the load. The power gauge further includes a first integrator configured to integrate a voltage at the first terminal of the current sense resistor during a time period and to output a first integrated voltage. The power gauge further includes a second integrator configured to integrate a voltage at the second terminal of the current sense resistor during the time period and to output a second integrated voltage. A difference between the first and second integrated voltages can be used to accurately determine the current consumed by the load during the time period.

20 Claims, 4 Drawing Sheets

POWER GAUGE FOR ACCURATE MEASUREMENT OF LOAD CURRENT

BACKGROUND OF THE INVENTION

1. Field of the Invention

The present invention is generally in the field of electronics. More particularly, the present invention is in the field of electronic devices relying on battery power.

2. Background

An electronic device, such as a cell phone or laptop computer, typically includes a power gauge (also referred to as a "fuel gauge") for determining the amount of charge remaining in the power source, such as a battery, powering the device. To determine the amount of charge remaining in a power source, such as a battery, that provides power to a electronic device, such as a cell phone, the power gauge can determine the amount of charge consumed from the power source, which can then be used to determine the charge remaining in the power source.

A conventional power gauge can determine the amount of charge remaining in a power source, such as a battery, by periodically sampling the current drawn by an electronic device, also referred to as the "load current" in the present application. For example, the conventional power gauge may sample the current drawn by an electronic device, such as a cell phone, from a battery every 0.5 seconds during a 10 second sampling time period. By averaging the samples of the current drawn by the electronic device, a processing block in the conventional power gauge can then determine the charge remaining in the electronic device battery. However, if the electronic device, for example a cell phone, does not continuously draw current during the sampling time period, the samples may not accurately represent the current drawn by the electronic device during the sampling time period. As a result, the conventional power gauge may not accurately determine the load current, which results in an inaccurate determination of the amount of charge remaining in the electronic device's battery.

SUMMARY OF THE INVENTION

A power gauge for accurate measurement of load current, substantially as shown in and/or described in connection with at least one of the figures, as set forth more completely in the claims.

DETAILED DESCRIPTION OF THE INVENTION

The present invention is directed to a power gauge for accurate measurement of load current. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
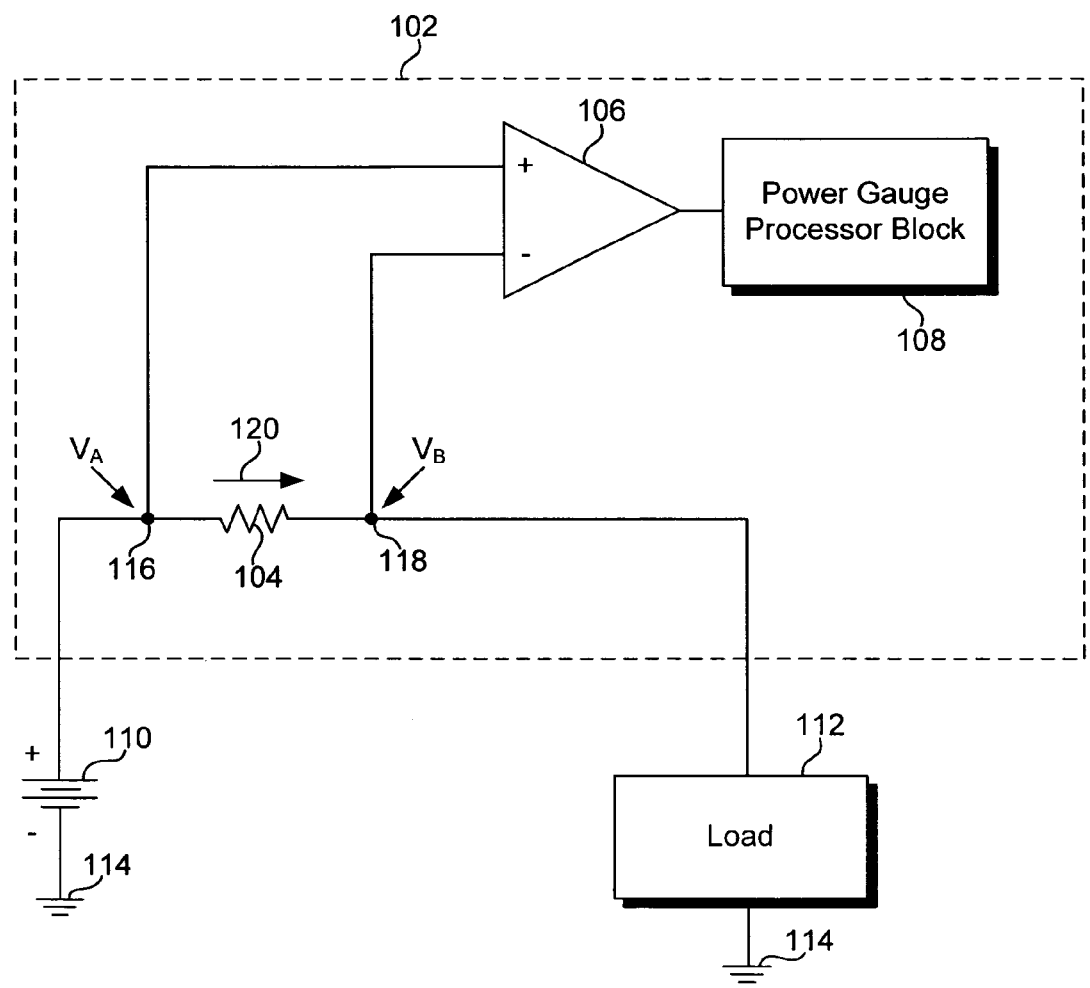
FIG. 1 shows a block diagram of a conventional exemplary power gauge.

FIG. 1 shows a block diagram of a conventional power gauge coupled to a load and a power source. FIG. 1 includes conventional power gauge 102, which includes current sense resistor 104, voltage differentiator 106, and power gauge processing block 108 (also referred to simply as "processing block 108"), power source 110, and load 112. As shown in FIG. 1, the negative terminal of power source 110 is coupled to ground 114 and the positive terminal of power source 110 is coupled to a first terminal of current sense resistor 104 and the positive (non-inverting) input of voltage differentiator 106 at node 116. Power source 110 can be, for example, a battery. Also shown in FIG. 1, a second terminal of current sense resistor 104 is coupled to a first terminal of load 112 and the negative (inverting) input of voltage differentiator 106 at node 118. Load 112 can be, for example, a portable electronic device, such as a cell phone, a digital camera, a personal digital assistant (PDA), a laptop computer, a portable DVD or MP3 player, or any other electronic device. Further shown in FIG. 1, a second terminal of load 112 is coupled to ground 114 and the output of voltage differentiator 106 is coupled to processing block 108.

When activated, i.e., turned on, load 112 can draw current 120 from power source 110, thereby causing a voltage to be generated across current sense resistor 104. By selecting the resistance of current sense resistor 104 to be substantially equal to 1.0 ohm, the voltage generated across current sense resistor 104 can be substantially equal to current 120. Thus, the difference between the voltage at node 116 ($V_A$) and the voltage at node 118 ($V_B$), i.e., the voltage across current sense resistor 104, is substantially equal to current 120. Voltage differentiator 106 can be configured to receive $V_A$ and $V_B$ at respective positive and negative inputs and to output the difference between $V_A$ and $V_B$ ($V_A-V_B$) to processing block 108. Processing block 108 can be configured to receive and sample $V_A-V_B$ at a particular sampling rate and determine the average current drawn from power source 110 during a selected sampling time period based on the number of samples received during that time period. Processing block 108 can also be configured to use the average current drawn from power source 110 during the selected sampling time period to determine the total charge consumed by load 112 during that time period and to then use it, i.e., the total charge consumed by load 112, to determine the charge remaining in power source 110.

Thus, conventional power gauge 102 utilizes discrete, i.e., periodic, sampling of $V_A-V_B$, i.e., current 120, to determine the average current consumed by load 112 during a selected sampling time period. However, if load 112 does not continuously draw current from power source 110, e.g., a battery, during the sampling time period, the discrete samples of current 120 taken by conventional power gauge 102 may not accurately represent the amount of current drawn by load 112. As a result, the average current consumed by load 112 as determined by conventional power gauge 102 may not accurately correspond to the actual current consumed by load 112 during the selected time period.

Figure 2:
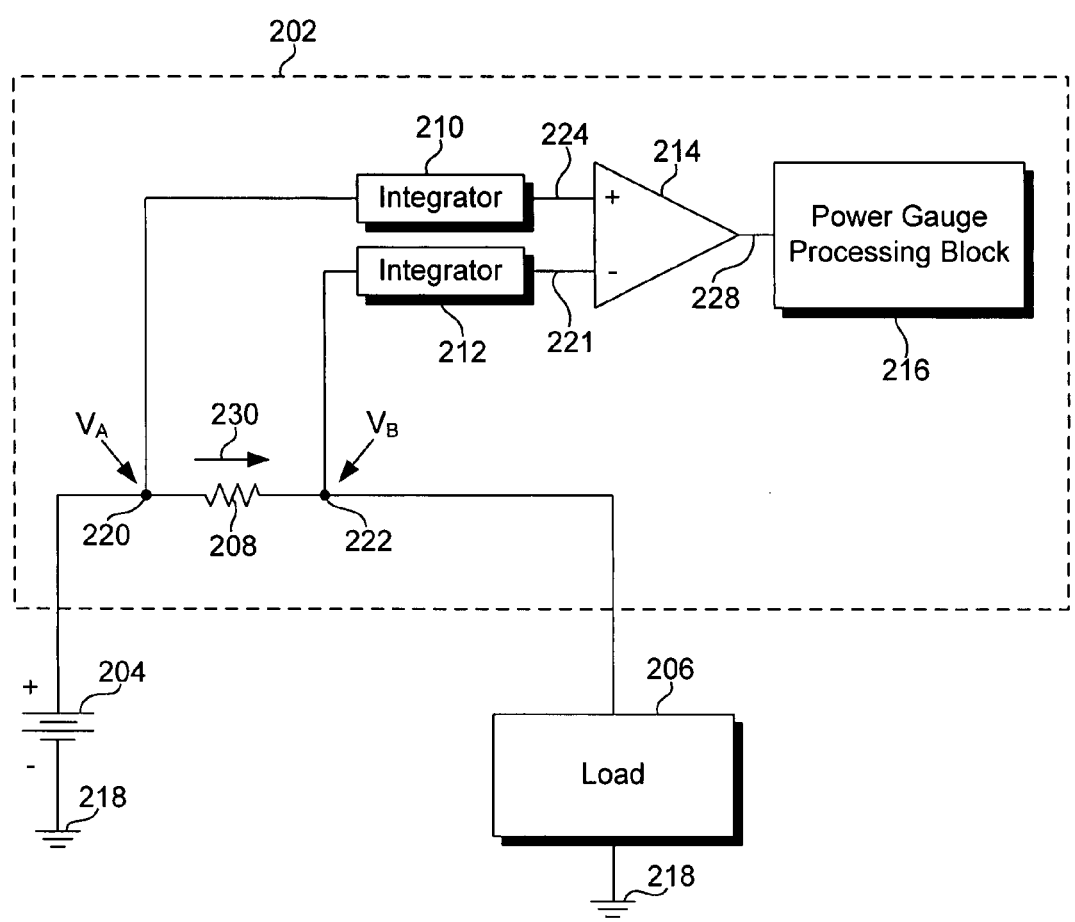
FIG. 2 shows a block diagram of an exemplary power gauge in accordance with one embodiment of the present invention.

FIG. 2 shows a block diagram of a power gauge coupled to a load and a power source in accordance with one embodiment of the present invention. FIG. 2 includes power gauge 202, power source 204, and load 206. In FIG. 2, power gauge 202 includes current sense resistor 208, integrators 210 and 212, voltage differentiator 214, and power gauge processing block 216 (also referred to simply as "processing block 216"). Power gauge 202 can reside in, for example, a cell phone, a camera, a PDA (personal digital assistant), a laptop computer, a DVD or MP3 player, or any other portable electronic device. In one embodiment, power gauge 202 can reside in a power management unit (PMU) of a cell phone. In one embodiment, power gauge 202 can be fabricated on a semiconductor die, which can include, for example, a memory array, a processor, a multi-media module, a transceiver, or other type of circuit.

As shown in FIG. 2, the negative terminal of power source 204 is coupled to ground 218 and the positive terminal of power source 204 is coupled to an input of integrator 210 and a first terminal of current sense resistor 208 at node 220. Power source 204 can be, for example, a battery that provides a DC voltage and current. Also shown in FIG. 2, the second terminal of current sense resistor 208 is coupled to an input of integrator 212 and a first terminal of load 206 at node 222 and a second terminal of load 206 is coupled to ground 218. Load 206 can be, for example, a portable electronic device, such as a cell phone, a camera, a PDA, a laptop computer, a DVD or MP3 player or any other electronic device where an accurate power gauge is required. Load 206 can also be, for example, a semiconductor die including a circuit such as a processor, a memory array, a multi-media module, a transceiver, or other type of circuit for which continuous measurement of current consumption is desired. In the present embodiment, load 206 can draw a constant current from power source 204. In another embodiment, load 206 can draw a variable current from a power source, such as a battery. In the present embodiment, current sense resistor 208 can have a resistance substantially equal to 1.0 ohm. However, as manifestly appreciated by one or ordinary skill in the art, current sense resistor 208 may also have a resistance other than 1.0 ohm.

Further shown in FIG. 2, the output of integrator 210 is coupled to positive (non-inverting) input 224 of voltage integrator 214, the output of integrator 212 is coupled to negative (inverting) input 226 of voltage integrator 214, and output 228 of voltage integrator 214 is coupled to the input of processing block 216. Integrator 210 can be configured to continuously sample and integrate $V_A$, i.e., the voltage at node 220, during a sampling time period and output an integrated voltage, i.e., an integrated value of $V_A$, representing the average value of $V_A$ during the sampling time period. Similarly, integrator 212 can be configured to continuously sample and integrate $V_B$, i.e., the voltage at node 222, over the sampling time period and output an integrated voltage, i.e., an integrated value of $V_B$, representing the average value of $V_B$ over the sampling time period. The duration of the sampling time period can be selected to meet the requirements of a particular application. As an example, the duration of the sampling time period may be approximately 10.0 seconds.

Integrators 210 and 212 can each have a high input impedance, which causes the integrators to draw only a minimal current at respective nodes 220 and 222. By way of example, integrators 210 and 212 can each have an input impedance of approximately 1.0 mega ohm. Integrators 210 and 212 can draw a current of, for example, approximately 5.0 microamperes (µA) or less at respective nodes 220 and 222. However, the input impedances of integrators 210 and 212 can be selected to meet the specific requirements of a particular application of the invention's power gauge.

Voltage differentiator 214 can be configured to receive integrated voltages from integrators 210 and 212 at respective positive and negative inputs 224 and 226 and to output an integrated voltage equal to the difference between the integrated voltages outputted by integrators 210 and 212. Since the resistance of current sense resistor 208 is substantially equal to 1.0 ohm, current 230, i.e., the current that flows through current sense resistor 208 when load 318 is turned on, is substantially equal to $V_A - V_B$, i.e., the voltage across current sense resistor 208. Since integrators 210 and 212 draw minimal current at respective nodes 220 and 222 due to their high input impedances, current 230 is substantially equal to the current drawn by load 206 from power source 204. Thus, output 228 of voltage differentiator 214, i.e., the difference between the integrated $V_A$ at node 220 provided by integrator 210 and the integrated $V_B$ at node 222 provided by integrator 212, which is inputted into processing block 216, is substantially equal to the integrated, i.e., average, current drawn by load 218 from power source 204 over the selected sampling time period.

Processing block 216 can be configured to receive output 228 from voltage differentiator 214, to determine the integrated, i.e., average, current consumed by load 206 during the sampling time period, and to determine the amount of charge consumed by load 206 during the sampling time period. Processing block 216 can also be configured to utilize the amount of charge consumed by load 206 to determine the remaining amount of charge on power source 204, e.g., a battery, at the end of the sampling time period.

The operation of the invention's power gauge 202 in combination with power source 204 and load 206 will now be discussed. When turned on, load 206, e.g., a cell phone, draws current 230 through current sense resistor 208 from power source 204, e.g., a battery. Since current sense resistor 208 is substantially equal to 1.0 ohm, $V_A - V_B$, i.e., the voltage across current sense resistor 208, is substantially equal to current 230. Respective integrators 210 and 212 continuously sample and integrate $V_A$ and $V_B$ over a selected sampling time period and output integrated voltages to respective inputs of voltage differentiator 214. Voltage differentiator 214 determines an integrated voltage equal to the difference between the integrated values of $V_A$ and $V_B$, which corresponds to the average value of current 230 drawn by load 206 during the sampling time period, and outputs the integrated voltage to processing block 216. Since integrators 210 and 212 continuously sample $V_A$ and $V_B$ during the sampling time period, the average value of current 230, which is substantially equal to the average current drawn by load 206 over the sampling time period, is accurately represented at output 228 of voltage differentiator 214.

Thus, by utilizing integrators to continuously sample the current flowing through a current sense resistor coupled between a current source, such as a battery, and a load, such as a cell phone, the invention's power gauge 202 can accurately determine the average current drawn by the load during a selected sampling time period. As a result, the invention's power gauge can also accurately determine the amount of charge consumed by the load during the sampling time period and, further, determine the remaining charge in the power source, e.g., battery, at the end of the sampling time period. In contrast, conventional power gauge 102 in FIG. 1 utilizes discrete sampling to sample the current flowing through a current sense resistor coupled between a load and a power source. As a result, the invention's power gauge more accurately measures the average current consumed by the load during a sampling time period compared to the conventional discrete sampling power gauge.

Figure 3:
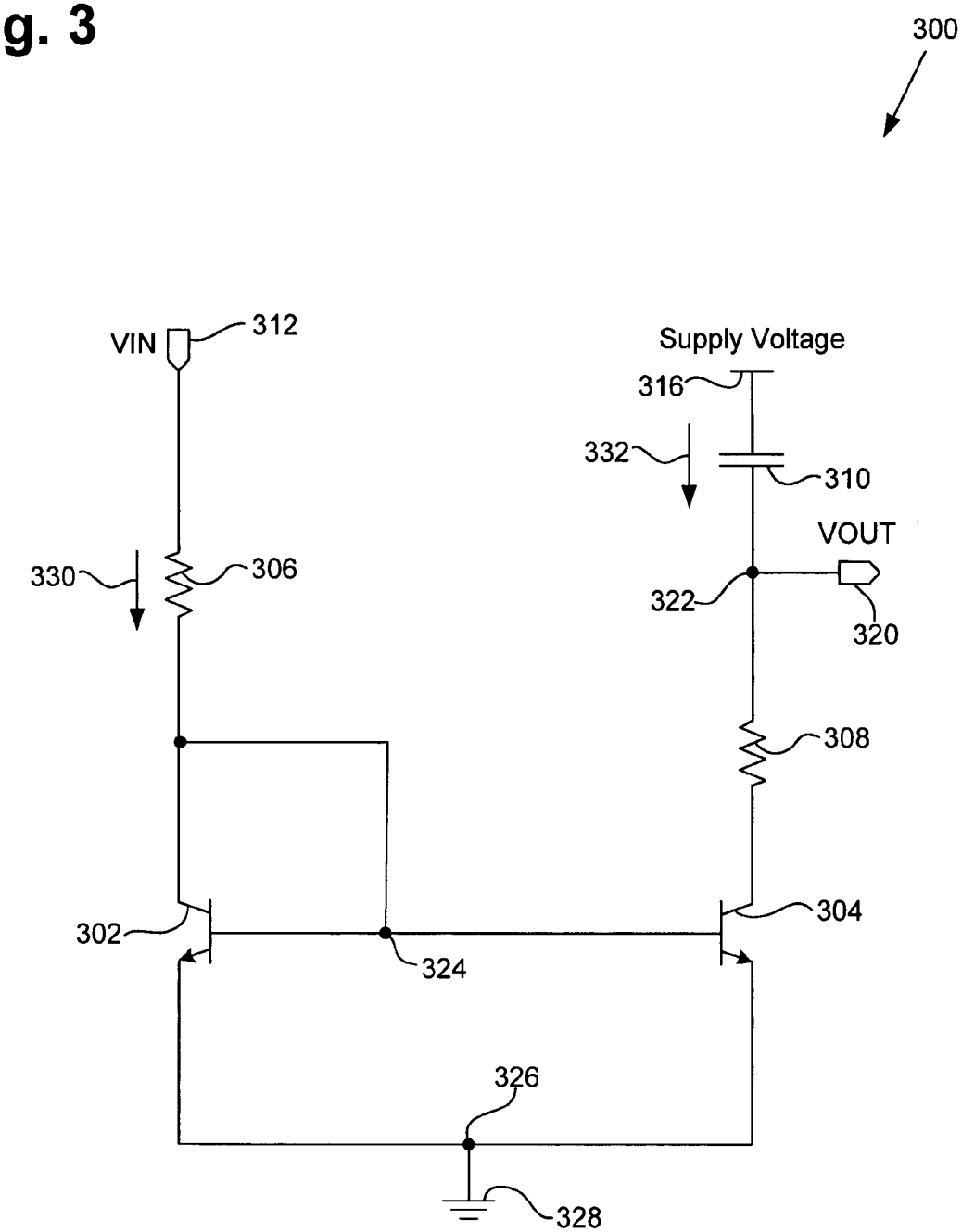
FIG. 3 shows a circuit diagram of an exemplary integrator for an exemplary power gauge in accordance with one embodiment of the present invention.

FIG. 3 shows an example of a circuit diagram of an integrator for a power gauge in accordance with one embodiment of the present invention. In FIG. 3, integrator 300 can correspond to either integrator 210 or integrator 212 in power gauge 202 in FIG. 2. Integrator 300 includes transistors 302 and 304, resistors 306 and 308, and capacitor 310. Integrator 300 can receive input voltage (VIN) 312 at node 314 and supply voltage 316, e.g., VCC, at node 318 and provide output voltage (VOUT) 320 at node 322.

As shown in FIG. 3, VIN 312 is coupled to a first terminal of resistor 306 at node 314 and a second terminal of resistor 306 is coupled to the collector and base of transistor 302 and the base of transistor 304 at node 324. Transistors 302 and 304 can each be a bipolar transistor, such as an NPN transistor. In other embodiments, transistors 302 and 304 may be PNP transistors, field effect transistors (FETs), or other suitable type of transistor. Resistor 306 might have a value of, for example, 1000.0 kilo ohms. Also shown in FIG. 3, the emitters of transistors 302 and 304 are coupled to ground 328 at node 326, the collector of transistor 304 is coupled to a first terminal of resistor 308, and a second terminal of resistor 308 is coupled to VOUT 320 and a first terminal of capacitor 310 at node 322. Resistor 308 might have a value of, for example, 100.0 kilo ohms. Further shown in FIG. 3, a second terminal of capacitor 310 is coupled to supply voltage 316, which can be VCC. Capacitor 310 might have a value of, for example, 10.0 microfarads.

The operation of integrator 300 will now be discussed. Transistors 302 and 304 are coupled together in a current mirror configuration and are selected such that current 330, which flows through resistor 306 and transistor 302 is substantially equal to current 332, which flows through capacitor 310, resistor 308, and transistor 304. In integrator 330, capacitor 310 can integrate current 332 over a selected integration time period between time t1 and time t2. By way of example, time t1 can be equal to 0.0 seconds and time t2 can be equal to 10.0 seconds. The selected integration time period, i.e., t2−t1, can be, for example, 10.0 seconds. VOUT 320, i.e., the output voltage of integrator 300, can be represented by the equation:

$$VOUT = VCC - \frac{1}{C}\int_{t1}^{t2} i \cdot dt \qquad \text{equation (1)}$$

where VOUT is VOUT 320, VCC is supply voltage 316, C is the capacitance of capacitor 310, and i is current 332, which is integrated from time t1 to time t2 in equation (1). Since current 332 is equal to current 330, i can be represented by the equation:

$$i = \frac{VIN - Vbe}{R} \qquad \text{equation (2)}$$

where VIN is VIN 312, Vbe is the base-to-emitter voltage of transistor 302, and R is the resistance of resistor 306. Equations (1) and (2) can be combined to form the equation:

$$VOUT = VCC - \frac{1}{C}\int_{t1}^{t2} \frac{VIN - Vbe}{R} \cdot dt. \qquad \text{equation (3)}$$

In equation (3), VCC, Vbe, and R can each be considered to have a constant value. Thus, equation (3) can be represented as:

$$VOUT = K - \beta \int_{t1}^{t2} VIN \cdot dt \qquad \text{equation (4)}$$

where K and β are constant values. The relationship between VOUT and VIN in equation (4) can be represented by the equation:

$$VOUT \propto D \cdot VIN + K \qquad \text{equation (5)}$$

where D and K are constant values. Thus, as shown in equation (5), VOUT 320, i.e., the output voltage of integrator 300 at node 322, is linearly proportional to VIN 312, i.e., the input voltage of integrator 300 at node 314, plus a constant value, i.e., K.

As discussed above, capacitor 310 can integrate current 332, which has a linear relationship with VIN 312, during a sampling time period. Thus, VOUT 320, which corresponds to the integrated value of VIN 312 during the sampling time period, is linearly proportional to VIN 312. As a result, integrator 300 can continuously sample an input voltage, i.e., VIN 312, integrate the sampled voltage during a sampling time period, and output an integrated voltage that is linearly proportional to the input voltage, plus a constant value.

Figure 4:
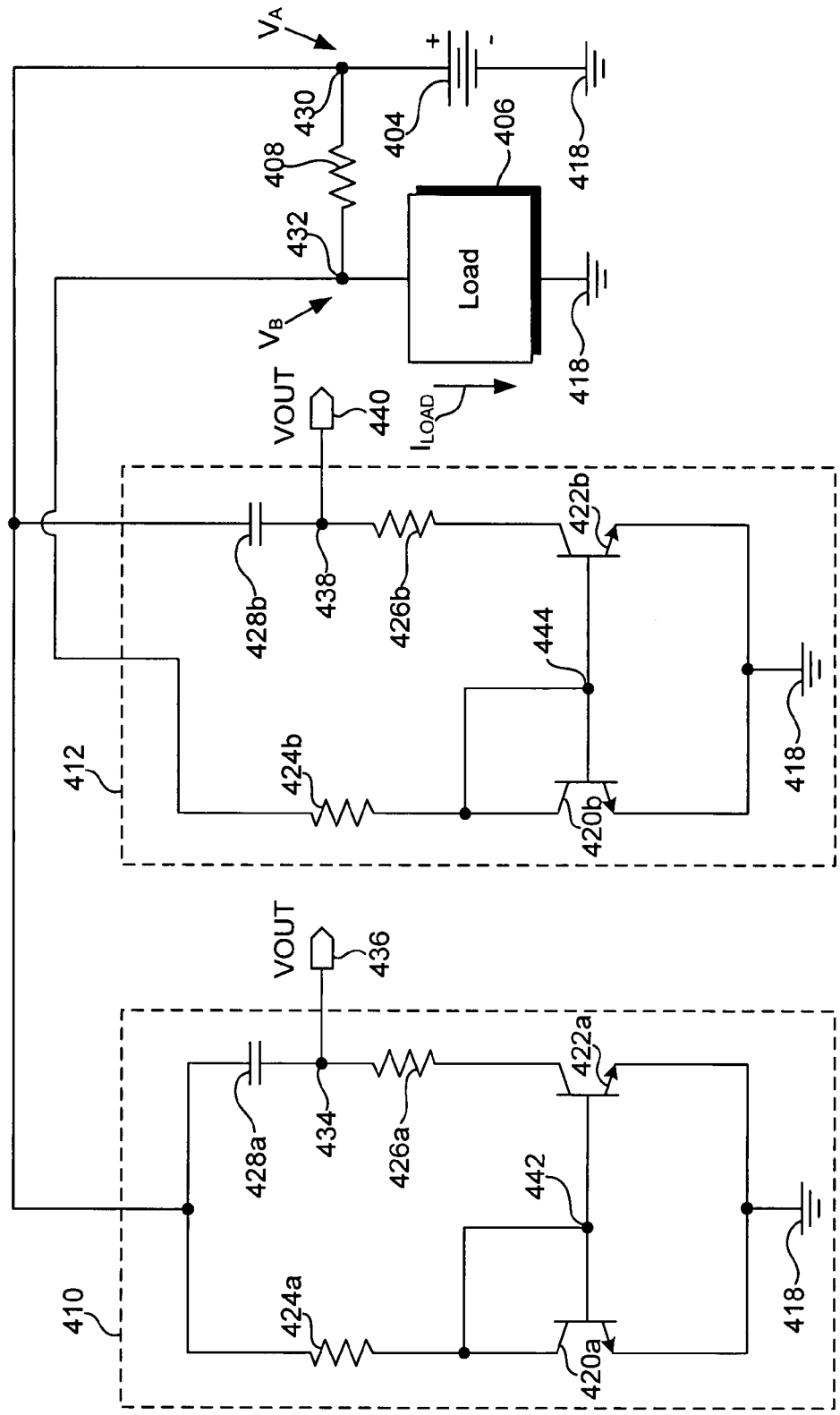
FIG. 4 shows a circuit diagram of exemplary integrators used in an exemplary power gauge in accordance with one embodiment of the present invention.

FIG. 4 shows a circuit diagram of two integrators coupled to respective terminals of a current sense resistor, which is coupled between a load and a power source, in accordance with one embodiment of the present invention. In FIG. 4, power source 404, load 406, current sense resistor 408, integrators 410 and 412, and ground 418 correspond, respectively, to power source 204, load 206, current sense resistor 208, integrators 210 and 212, and ground 218 in FIG. 2. Also, integrators 410 and 4-12 each correspond to integrator 300 in FIG. 3. In particular, transistors 420a and 422a, resistors 424a and 426a, and capacitor 428a in integrator 410 and transistors 420b and 422b, resistors 424b and 426b, and capacitor 428b in integrator 412 correspond, respectively, to transistors 302 and 304, resistors 306 and 308, and capacitor 310 in integrator 300 in FIG. 3.

As shown in FIG. 4, first terminals of resistor 424a and capacitors 428a and 428b are coupled to a first terminal of current sense resistor 408 and the positive terminal of power source 404 at node 430 and a first terminal of resistor 424b and a terminal of load 406 are coupled to a second terminal of current sense resistor 408 at node 432. Current sense resistor 408, which corresponds to current sense resistor 208 in FIG. 2, can have a resistance substantially equal to 1.0 ohm, for example. Power source 404, which can be a battery, provides a constant supply voltage, e.g., VCC, for integrators 410 and 412 at node 430. Also shown in FIG. 4, a second terminal of load 406 and the negative terminal of power source 404 are coupled to ground 418, a second terminal of capacitor 428a is coupled to a first terminal of resistor 426a at node 434, which provides output voltage (VOUT) 436, and a second terminal of capacitor 428b is coupled to a first terminal of resistor 426b at node 438, which provides VOUT 438.

Further shown in FIG. 4, second terminals of respective resistors 424a and 426a are coupled to collectors of transistors 420a and 422a, the bases of transistors 420a and 422a are coupled to node 442, and the emitters of transistors 420a and 422a are coupled to ground 418. Also shown in FIG. 4, second terminals of respective resistors 424b and 426b are coupled to collectors of transistors 420b and 422b, the bases of transistors 420b and 422b are coupled to node 444, and the emitters of transistors 420b and 422b are coupled to ground 418.

The operation of integrators 410 and 412 in combination with power source 404, load 406, and current sense resistor 408 will now be discussed. When turned on, load 406, e.g., a cell phone, draws a current, i.e., $I_{LOAD}$ 446, from power source 404, e.g., a battery, via current sense resistor 408. In the present embodiment, load 406 can have a constant input impedance, which causes $I_{LOAD}$ 446 to be a constant current. In one embodiment, $I_{LOAD}$ 446 can be a variable current. Due to their high input resistances, integrators 410 and 412 draw minimal current at respective nodes 430 and 432. Thus, the current flowing through current sense resistor 408 is substantially equal $I_{LOAD}$ 446. By selecting the resistance of current sense resistor 408 to be substantially equal to 1.0 ohm, the current flowing through current sense resistor 408, which is substantially equal to $I_{LOAD}$ 446, can be substantially equal to the difference between $V_A$, the voltage at node 430, and $V_B$, the voltage at node 432.

Integrators 410 and 412 each operate in a similar manner as integrator 300 discussed above. Thus, the output of integrator 410, i.e., VOUT 436, corresponds to an integrated value of $V_A$, i.e., the voltage coupled to the input of integrator 410, during a sampling time period. Similarly, the output of integrator 412, i.e., VOUT 440, corresponds to an integrated value of $V_B$, i.e., the voltage coupled to the input of integrator 412, during the sampling time period. Thus, the difference between VOUT 440 and VOUT 436 corresponds to the average current drawn by load 406, i.e., the integrated value of $I_{LOAD}$ 446, during the sampling time period. Since $V_A$ and $V_B$ are continuously sampled by respective integrators 410 and 412 during the sampling time period, the integrated output voltage provided by VOUT 440-VOUT 436 accurately corresponds to the average current drawn by load 406 during the sampling time period. By inputting VOUT 440-VOUT 436 into processing block 216 in power gauge 202 in FIG. 2, processing block 216 can accurately determine the amount of charge consumed by load 406, e.g., a cell phone, during the sampling time period. The amount of charge consumed by load 406 can then by utilized by processing block 216 to advantageously determine an accurate amount of charge remaining in power source 404, e.g., a battery, at the end of the sampling time period.

The invention's power gauge, such as power gauge 202 in FIG. 2, can also be utilized to accurately measure current consumption in a semiconductor die, such as a semiconductor die including, for example, a memory array, a processor, a multi-media module, a transceiver, or other type of circuit. By fabricating the invention's power gauge on a semiconductor die, such as a semiconductor die including, for example, any of the above discussed circuits, one or more software commands could be utilized to access the invention's power gauge and, thereby, accurately measure the current consumption of the die during a selected sampling time period. Thus, by fabricating the invention's power gauge on each semiconductor die on a circuit board, current consumption of any die on the circuit board could be accurately measured by utilizing software commands to access the power gauge fabricated on that die.

Thus, as discussed above, by utilizing integrators to continuously sample voltages at respective terminals of a current sense resistor coupled between a load, such as a cell phone, and a power source, such as a battery, the invention's power gauge can accurately measure the average current consumed by the load during a selected sampling time period. In contrast, conventional power gauge 102 in FIG. 2 only periodically samples voltages at respective terminals of a current sense resistor coupled between a load and a power source. Thus, by utilizing integrators to continuously sample the voltages at the respective terminals of the current sense resistor, the invention's power gauge can more accurately measure average current consumed by a load during a selected sampling time period compared to conventional power gauge 202.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a power gauge for accurate measurement of load current has been described.

The invention claimed is:

1. A power gauge to accurately measure current consumed by a load coupled to a power source, said power gauge comprising:
a current sense resistor having a first terminal coupled to said power source and a second terminal coupled to said load;
a first integrator configured to integrate a voltage at said first terminal of said current sense resistor during a time period and output a first integrated voltage;
a second integrator configured to integrate a voltage at said second terminal of said current sense resistor during said time period and output a second integrated voltage;
wherein an output voltage corresponding to an average of a difference between said voltage at said first terminal and said voltage at said second terminal determines said current consumed by said load during said time period.

2. The power gauge of claim 1 further comprising a voltage differentiator configured to receive said first and second integrated voltages and to provide said output voltage.

3. The power gauge of claim 2 further comprising a processing block configured to receive said output voltage from said voltage differentiator and to determine said current consumed by said load during said time period.

4. The power gauge of claim 1, wherein said load is a portable electronic device selected from the group consisting of a cell phone, a camera, a personal digital assistant, a laptop computer, a portable DVD, and an MP3 player.

5. The power gauge of claim 2, wherein said first integrated voltage is received at a non-inverting input of said voltage differentiator and said second integrated voltage is received at an inverting input of said voltage differentiator.

6. The power gauge of claim 1, wherein said first integrated voltage is linearly proportional to said voltage at said first terminal of said current sense resistor and said second integrated voltage is linearly proportional to said voltage at said second terminal of said current sense resistor.

7. The power gauge of claim 1, wherein said power source is a battery.

8. The power gauge of claim 1, wherein said first integrator continuously samples said voltage at said first terminal of said current sense resistor during said time period and said second integrator continuously samples said voltage at said second terminal of said current sense resistor during said time period.

9. The power gauge of claim 1, wherein said power gauge is fabricated on a semiconductor die.

10. The power gauge of claim 9, wherein said semiconductor die includes a circuit selected from the group consisting of a memory array, a processor, a multi-media module, and a transceiver.

11. A power gauge comprising:
a first integrator configured to integrate a voltage at a first terminal of a current sense resistor and output a first integrated voltage, said first terminal of said current sense resistor coupled to a power source;
a second integrator configured to integrate a voltage at a second terminal of said current sense resistor and output a second integrated voltage, said second terminal of said current sense resistor coupled to a load;
a voltage differentiator configured to receive said first and second integrated voltages and to provide an output voltage corresponding to an average of a difference between said voltage at said first terminal and said voltage at said second terminal;
wherein said output voltage corresponds to an average current consumed by said load.

12. The power gauge of claim 11 further comprising a processing block configured to receive said output voltage from said voltage differentiator and to determine said average current consumed by said load.

13. The power gauge of claim 11, wherein said load draws a constant current through said current sense resistor.

14. The power gauge of claim 11, wherein said load draws a variable current through said current sense resistor.

15. The power gauge of claim 11, wherein said load is a portable electronic device selected from the group consisting of a cell phone, a camera, a personal digital assistant, a laptop computer, a portable DVD, and an MP3 player.

16. The power gauge of claim 11, wherein said first integrated voltage is linearly proportional to said voltage at said first terminal of said current sense resistor and said second integrated voltage is linearly proportional to said voltage at said second terminal of said current sense resistor.

17. The power gauge of claim 11, wherein said first and second integrators each includes a pair of transistors coupled together in a current mirror configuration.

18. The power gauge of claim 11, wherein said power source is a battery.

19. The power gauge of claim 11, wherein said power gauge is fabricated on a semiconductor die.

20. The power gauge of claim 19, wherein said semiconductor die includes a circuit selected from the group consisting of a memory array, a processor, a multi-media module, and a transceiver.

* * * * *